United States Patent
Jeong et al.

(10) Patent No.: US 9,570,417 B2
(45) Date of Patent: Feb. 14, 2017

(54) CHIP BONDING APPARATUS AND CHIP BONDING METHOD

(71) Applicant: Samsung Display Co., Ltd., Yongin (KR)

(72) Inventors: Seong Beom Jeong, Hwaseong-si (KR); Min Su Kim, Asan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 14/706,752

(22) Filed: May 7, 2015

(65) Prior Publication Data

US 2016/0155719 A1 Jun. 2, 2016

(30) Foreign Application Priority Data

Dec. 1, 2014 (KR) .......................... 10-2014-0169755

(51) Int. Cl.
*H01L 21/00* (2006.01)
*H01L 23/00* (2006.01)

(52) U.S. Cl.
CPC ..... *H01L 24/83* (2013.01); *H01L 2224/83048* (2013.01); *H01L 2224/83091* (2013.01); *H01L 2224/83121* (2013.01); *H01L 2224/83851* (2013.01)

(58) Field of Classification Search
CPC .......... H01L 24/28; H01L 24/83; H01L 24/86; H01L 24/50
See application file for complete search history.

(56) References Cited

U.S. PATENT DOCUMENTS

| | | | | |
|---|---|---|---|---|
| 6,223,800 B1 * | 5/2001 | Kim | ..................... | B23K 20/023 156/556 |
| 2014/0098055 A1 * | 4/2014 | Choi | ..................... | G06F 3/0416 345/174 |

FOREIGN PATENT DOCUMENTS

| | | | |
|---|---|---|---|
| JP | 01117284 | A * | 5/1989 |
| JP | 2003195335 | A * | 7/2003 |
| KR | 20-0266542 | | 2/2002 |
| KR | 10-2005-0000499 | | 1/2005 |
| KR | 10-2009-0090762 | | 8/2009 |

(Continued)

OTHER PUBLICATIONS

R.A. Islam, Y.C. Chan; "Effect of Microwave Preheating on the Bonding Performance of Flip Chip on Flex Joint"; Sep. 17, 2003; Microelectronics Reliability, 44, pp. 815-821.*

(Continued)

*Primary Examiner* — Zandra Smith
*Assistant Examiner* — Evan Clinton
(74) *Attorney, Agent, or Firm* — H.C. Park & Associates, PLC

(57) ABSTRACT

The chip bonding apparatus used in a chip bonding method includes a heating unit for heating an anisotropic conductive film at a first temperature; an attachment unit for attaching an integrated circuit chip to the anisotropic conductive film; a stage on which a substrate is seated; a chip transport unit for moving and aligning the integrated circuit chip that is attached to the anisotropic conductive film on the substrate; and a bonding head arranged above the stage to bond the integrated circuit chip that is attached to the anisotropic conductive film onto the substrate through thermo-compression of the integrated circuit chip onto the substrate at a second temperature that is lower than the first temperature.

12 Claims, 11 Drawing Sheets

(56) References Cited

FOREIGN PATENT DOCUMENTS

KR    10-2013-0141495    12/2013

OTHER PUBLICATIONS

J. Leu, C. C. Chang, A. Chen, M. H. Lin, K. F. Huang, "Effects of localized warpage and stress on chip-on-glass packaging," Journal of the SID, vol. 20, No. 1, 2012.

* cited by examiner

CHIP BONDING APPARATUS AND CHIP BONDING METHOD

CROSS-REFERENCE TO RELATED APPLICATION

This application claims priority from and the benefit of Korean Patent Application No. 10-2014-0169755, filed on Dec. 1, 2014, which is hereby incorporated by reference for all purposes as if fully set forth herein.

BACKGROUND

Field

Exemplary embodiments relate to a chip bonding apparatus and a chip bonding method.

Discussion of the Background

An organic light emitting display device is a type of self-luminous display device, and has been recognized as a next-generation display device since it has certain advantages, such as a wide viewing angle, superior contrast, and high response speed.

An organic light emitting display device may include a display panel displaying an image. The display panel may include organic light emitting elements, a driving circuit unit for driving the organic light emitting elements, an integrated circuit chip for transferring signals to the driving circuit, and a flexible printed circuit board for transferring the signals to an integrated circuit chip.

Typically, the integrated circuit chip and the flexible printed circuit board are electrically connected to metal wires that are arranged on a pad portion of a substrate included in the display panel through an anisotropic conductive film that includes conductive balls. A thin insulator surrounds the conductive ball in the anisotropic conductive film. The anisotropic conductive film is arranged between the integrated circuit chip and the pad portion and between the flexible printed circuit board and the substrate. The thin insulator may be broken by a thermo-compression process using a bonding head as the integrated circuit chip and the flexible printed circuit board are connected to the metal wires arranged on the pad portion of the substrate through the conductive ball.

However, since the temperature of the bonding head is high during the thermo-compression process, flexural deformation may occur on the integrated circuit chip that is pressed by the bonding head due to the high-temperature heat. Such flexural deformation of the integrated circuit chip may cause bumps that are arranged below the integrated circuit chip to come in partial contact with the anisotropic conductive film. In this case, reliability for the electrical connection between the integrated circuit chip and the metal wires arranged on the pad portion of the substrate through the anisotropic conductive film may be deteriorated.

The above information disclosed in this Background section is only for enhancement of understanding of the background of the inventive concept, and, therefore, it may contain information that does not form the prior art that is already known in this country to a person of ordinary skill in the art.

SUMMARY

Exemplary embodiments provide a thermo-compression process for breaking the insulator that surrounds the conductive ball included in an anisotropic conductive film and is arranged between the integrated circuit chip and the pad portion of the substrate. The breaking is performed in a manner in which the substrate, the anisotropic conductive film, and the integrated circuit chip are laminated successively on a stage. Then, high-temperature heat (e.g., heat at a temperature of about 250° C. to 350° C.) that is set on the bonding head is transferred to the anisotropic conductive film while the integrated circuit chip is pressed by the bonding head, which is arranged above the integrated circuit chip.

Additional features of the invention will be set forth in the description which follows, and in part will be apparent from the description, or may be learned by practice of the invention.

An exemplary embodiment of the present invention discloses a chip bonding apparatus including a heating unit for heating an anisotropic conductive film at a first temperature; an attachment unit for attaching an integrated circuit chip to the anisotropic conductive film; a stage on which a substrate is seated; a chip transport unit for moving and aligning the integrated circuit chip that is attached to the anisotropic conductive film on the substrate; and a bonding head arranged above the stage to bond the integrated circuit chip that is attached to the anisotropic conductive film onto the substrate through thermo-compression of the integrated circuit chip onto the substrate at a second temperature that is lower than the first temperature.

An exemplary embodiment of the present invention also discloses a chip bonding method including: heating an anisotropic conductive film at a first temperature using a heating unit; attaching an integrated circuit chip to the anisotropic conductive film using an attachment unit; moving and aligning the integrated circuit chip that is attached to the anisotropic conductive film on a substrate that is seated on a stage using a chip transport unit; and bonding the integrated circuit chip that is attached to the anisotropic conductive film onto the substrate through thermo-compression of the integrated circuit chip onto the substrate at a second temperature that is lower than the first temperature using a bonding head arranged on an upper portion of the stage.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

DETAILED DESCRIPTION OF THE ILLUSTRATED EMBODIMENTS

Figure 1:
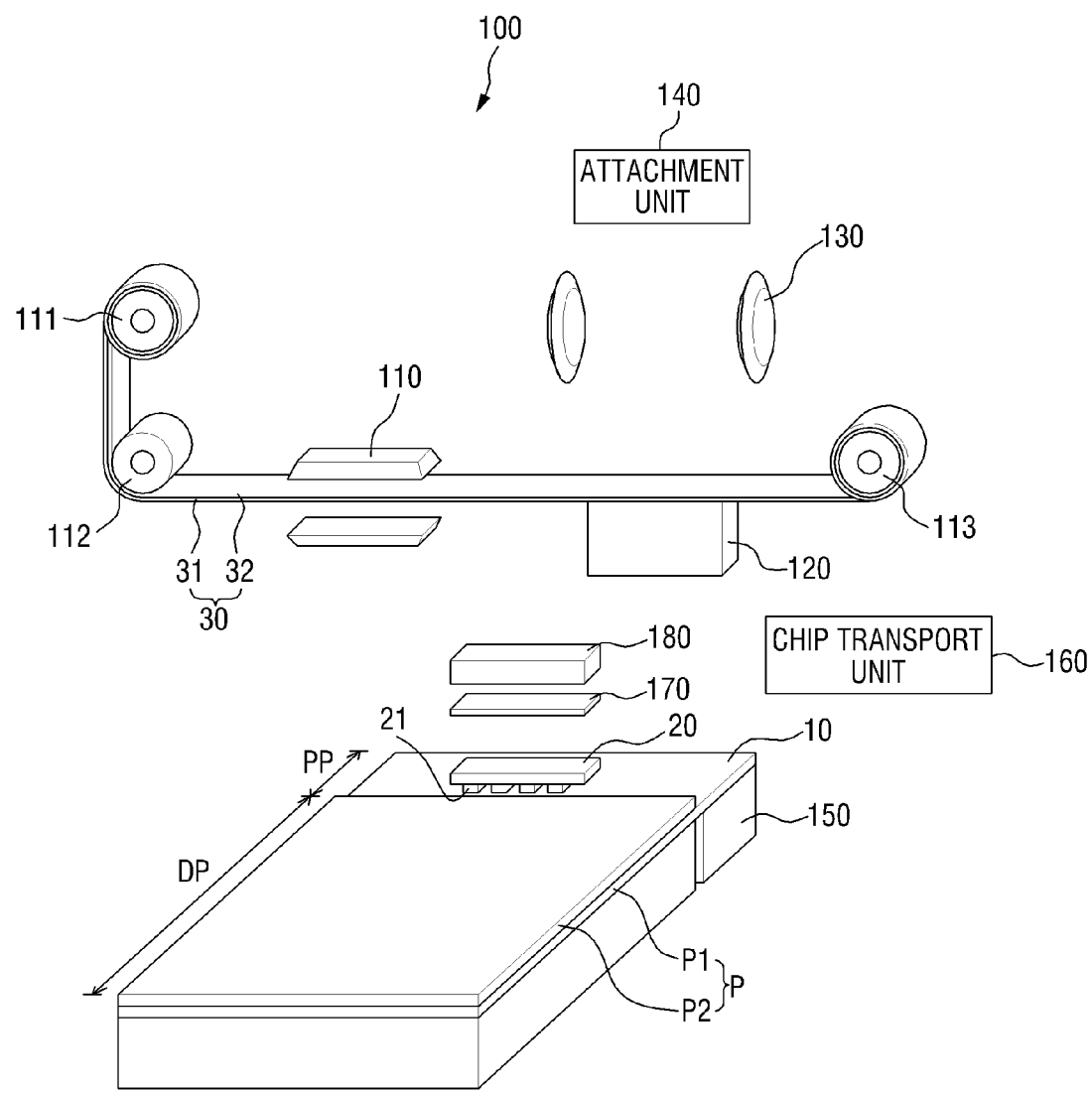
FIG. 1 is a view illustrating the configuration of a chip bonding apparatus according to an exemplary embodiment of the present invention.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, the present invention will be described in detail with reference to the accompanying drawings.

Figure 2:
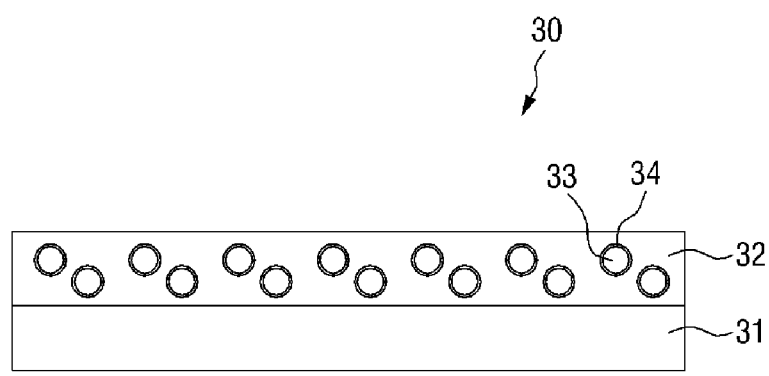
FIG. 2 is a cross-sectional view of an anisotropic conductive film of FIG. 1.
Figure 3:
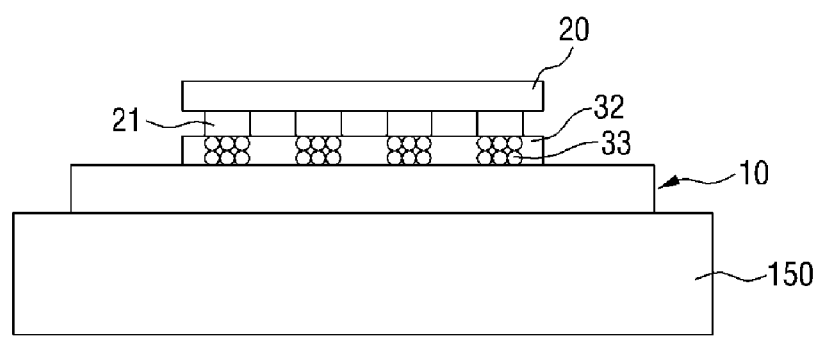
FIG. 3 is a cross-sectional view illustrating an integrated circuit chip that is bonded to a pad portion of a substrate by the chip bonding apparatus of FIG. 1.

FIG. 1 is a view illustrating the configuration of a chip bonding apparatus according to an exemplary embodiment of the present invention. FIG. 2 is a cross-sectional view of an anisotropic conductive film of FIG. 1. FIG. 3 is a cross-sectional view illustrating an integrated circuit chip that is bonded to a pad portion of a substrate by the chip bonding apparatus of FIG. 1.

Referring to FIG. 1, a chip bonding apparatus 100 according to an exemplary embodiment of the present invention includes a heating unit 110, a support 120, a cutting unit 130, an attachment unit 140, a stage 150, a chip transport unit 160, a buffering unit 170, and a bonding head 180. The chip bonding apparatus 100 may be used to bond an integrated circuit chip 20 to a substrate 10 when an adhesive layer 32 of an anisotropic conductive film 30 is interposed between the substrate 10 and the integrated circuit chip 20 using thermo-compression.

The heating unit 110 heats the anisotropic conductive film 30 before the integrated circuit chip 20 is bonded to the substrate 10. For example, the heating unit 110 may include a heating plate, and may move vertically to contact both surfaces of the anisotropic conductive film 30. The heating plate may be a plate having a built-in heater. Here, the heating unit 110 may heat the anisotropic conductive film 30 at a temperature of, for example, about 250° C. to 350° C. In this case, the adhesive layer 32 of the anisotropic conductive layer 30 may be melted.

The substrate 10 may be a substrate of a display panel that displays an image or a substrate of a touch screen panel to which a touch signal is input in a display device, such as a liquid crystal display device. For example, the substrate 10 may be a glass substrate or a flexible substrate. Further, the substrate 10 may be a printed circuit board (PCB) or a flexible printed circuit board (FPCB). Generally, the substrate 10 may be any material, so long as it is configured to be electrically connected to the integrated circuit chip 20 that is mounted thereon.

In the current exemplary embodiment, display panel P includes a first display panel P1 and a second display panel P2. The substrate 10 may be a substrate of the first display panel P1 in an organic light emitting display device, but is not limited thereto. The substrate 10 may include a display portion DP that includes a plurality of signal lines and a plurality of organic light emitting elements, and a pad portion PP on which a plurality of metal wires connected to the plurality of signal lines are positioned and the integrated circuit chip 20 is mounted.

The integrated circuit chip 20 may be a chip that can transfer electrical signals to the substrate 10, and may be a driving chip that transfers a driving signal to the substrate 10 or a control chip that transfers a control signal to the substrate 10. The integrated circuit chip 20 may include conductive bumps 21 arranged on a lower portion thereof.

In an exemplary embodiment of the present invention, the integrated circuit chip 20 may be a driving chip that is mounted on the pad portion PP of the substrate 10 and may be electrically connected via the metal wires through the anisotropic conductive film 30 to transfer the driving signal to the metal wires.

The anisotropic conductive film 30 is interposed between the pad portion PP of the substrate 10 and the conductive bumps 21 of the integrated circuit chip 20 to electrically connect the metal wires arranged on the pad portion PP of the substrate 10 to the integrated circuit chip 20.

Referring to FIG. 2, the anisotropic conductive film 30 includes a release film 31 and an adhesive layer 32. The release film 31 may be an insulating film made of polyethylene terephthalate, but is not limited thereto. The adhesive layer 32 is formed on the release film 31, and may be, for example, thermosetting adhesives, such as epoxy or acrylic resin. Conductive balls 33 that are surrounded by thin insulators 34 are dispersed on the adhesive layer 32. The anisotropic conductive film 30 may be transported to a region where the heating unit 110 is arranged through a guide roller 112 when it is wound by a winding roller 111, and is then heated by the heating unit 110.

The support 120 is arranged between the guide roller 112 and a recovery roller 113, and supports the anisotropic conductive film 30 which is heated by the heating unit 110 and then is transported to the region where the cutting unit 130 is arranged. The support 120 provides a space in which a cutting process can be performed with respect to the anisotropic conductive film 30.

The cutting unit 130 may be arranged above the support 120 to face the adhesive layer 32 of the anisotropic conductive film 30. The cutting unit 130 cuts a boundary portion between a heated area HA (shown in FIG. 6) and a non-heated area of the adhesive layer 32 of the anisotropic conductive film 30 so as to separate the heated area and the non-heated area from each other. The cutting unit 130 may be a cutting wheel, but is not limited thereto.

The attachment unit 140 is arranged in a region that is spaced apart from the heating unit 110 in a horizontal direction, and may be arranged above the support 120 to face the adhesive layer 32 of the anisotropic conductive film 30. The attachment unit 140 may be configured to hold the integrated circuit chip 20, attach the integrated circuit chip 20 to the heated area HA (shown in FIG. 7) of the adhesive layer 32 of the anisotropic conductive film 30, and perform vertical movement to separate the integrated circuit chip 20 to which the heated area HA (shown in FIG. 7) is attached from the anisotropic conductive film 10 (see FIG. 8). The attachment unit 140 may include, for example, a robot. The anisotropic conductive film 30, from which the heated area HA (in FIG. 8) is separated by the attachment unit 140, may be recovered by the recovery roller 113.

The stage 150 supports the substrate 10 when the integrated circuit chip 20 is bonded to the metal wires (not shown) arranged on the pad portion PP of the substrate 10 through a thermo-compression process using the bonding head 180. The stage 10 may be configured in a divided state to independently support the display portion DP and the pad portion PP of the substrate 10, but is not limited thereto. The stage 150 may be set to have an ambient temperature, for example, a temperature of about 20° C. to 30° C., during the thermo-compression process using the bonding head 180.

The chip transport unit 160 may be configured to move and align the integrated circuit chip 20, to which the heated area HA of the adhesive layer 32 of the anisotropic conductive film 30 is attached, onto the pad portion PP of the substrate 10. The chip transport unit 160 may be, for example, a robot that can move and align the integrated circuit chip 20, but is not limited thereto.

The buffering unit 170 is arranged above the stage 150 to uniformly transfer pressure when the integrated circuit chip 20 that is arranged on the metal wires (not shown) arranged on the pad portion PP of the substrate 10 is pressed using the bonding head 180. The buffering unit 170 may include, for example, a silicon pad.

The bonding head 180 is arranged above the stage 150. The bonding head 180 is configured to perform vertical movement in the direction of the stage 150 and to bond the integrated circuit chip 20 arranged on the pad portion PP of the substrate 10 to the pad portion PP of the substrate 10 using compression pressure at a second temperature that is lower than the first temperature.

When the integrated circuit chip 20 is bonded to the pad portion PP of the substrate 10 by the bonding head 180, as illustrated in FIG. 3, the adhesive layer 32 of the anisotropic conductive film 30 that is interposed between the integrated circuit chip 20 and the pad portion PP of the substrate 10 is cured and is bonded to the integrated circuit chip 20 and the pad portion PP of the substrate 10. At the same time, the thin insulators 34 that surround the conductive balls 33 are broken, and thus the bump 21 of the integrated circuit chip 20 and the metal wire of the pad portion PP of the substrate 10 are electrically connected to each other through the conductive ball 33.

The second temperature may be, for example, about 20° C. to 30° C. Since the adhesive layer 32 of the anisotropic conductive film 30 has already been heated by the heating unit 110 and is provided to the pad portion PP of the substrate 10 in a melted state, the adhesive layer 32 of the anisotropic conductive film 30 may not be heated at high temperature that can melt the adhesive layer 32 of the anisotropic conductive film 30 when the integrated circuit chip 20 is bonded to the pad portion PP of the substrate 10 through the thermo-compression process using the bonding head 180. Accordingly, relatively low-temperature heat can be transferred to the integrated circuit chip 20 when the integrated circuit chip 20 is bonded to the pad portion PP of the substrate 10 through the thermo-compression process using the bonding head 180. Accordingly, the occurrence of the flexural deformation, which may occur on the integrated circuit chip 20 that is pressed by the high-temperature bonding head due to the high-temperature heat, can be reduced. Thus, the partial contact of the bumps of the integrated circuit chip 20 with the adhesive layer 32 of the anisotropic conductive film 30 can be reduced. As a result, deterioration of the reliability for the electrical connection between the pad portion PP of the substrate 10 and the integrated circuit chip 20 can be reduced.

Although not illustrated, the overall process using the chip bonding apparatus 100 may be controlled by the controller. The controller may be implemented by a computer or a similar device using software or a combination thereof.

As described above, since the chip bonding apparatus 100 according to an exemplary embodiment of the present invention includes the heating unit 110 that heats the anisotropic conductive film 30 before the integrated circuit chip 20 is bonded to the pad portion PP of the substrate 10 through the thermo-compression process using the bonding head 180, the bonding head 180 having low temperature can be used during the thermo-compression process using the bonding head 180.

Accordingly, the occurrence of the flexural deformation, which may occur on the integrated circuit chip 20 that is pressed by the high-temperature bonding head 180 during the thermo-compression process using the bonding head 180 due to the high-temperature heat, can be reduced, and thus the partial contact of a part of the bumps 21 of the integrated circuit chip 20 with the adhesive layer 32 of the anisotropic conductive film 30 can also be reduced. As a result, deterioration of the reliability for the electrical connection between the pad portion PP of the substrate 10 and the integrated circuit chip 20 can be reduced.

FIGS. 4 to 10 are views showing a chip bonding method using the chip bonding apparatus of FIG. 1.

Figure 4:
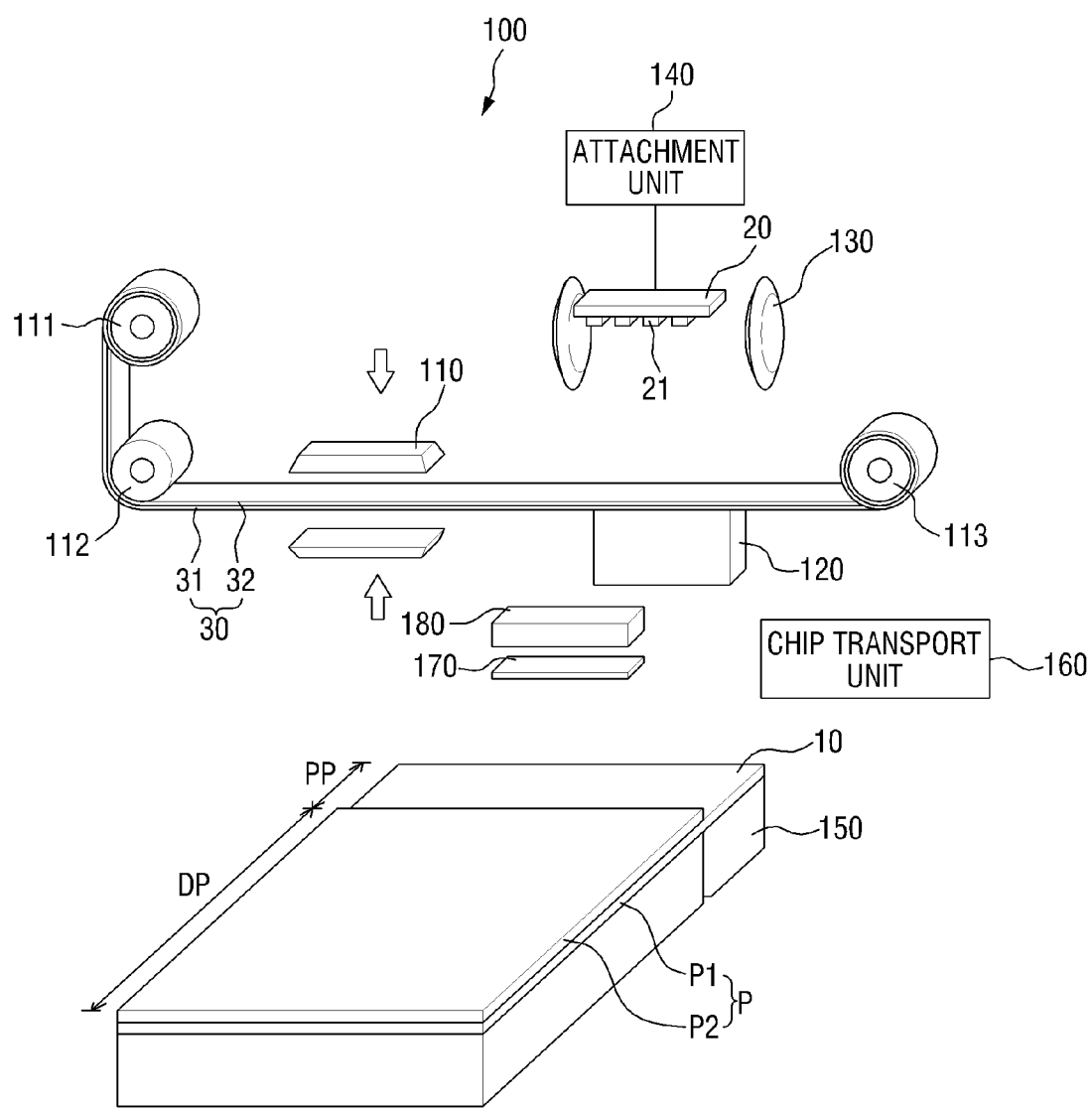
FIGS. 4, 5, 6, 7, 8, 9, and 10 are views explaining a chip bonding method using the chip bonding apparatus of FIG. 1.

Referring to FIG. 4, an anisotropic conductive film 30 is heated at a first temperature using a heating unit 110.

The anisotropic conductive film 30 may include a release film 31, and an adhesive layer 32 in which conductive balls 33 (as shown in FIG. 2) that are surrounded by thin insulators 34 (as shown in FIG. 2) are dispersed. The anisotropic conductive film 30 is transported to a region where the heating unit 110 is arranged through a guide roller 112 in a state where it is wound by a winding roller 111, and then is heated by the heating unit 110. The heating unit 110 may include, for example, a heating plate, and may perform vertical movement to contact both surfaces of the anisotropic conductive film 30. The heating plate may be a plate having a built-in heater, but is not limited thereto.

The first temperature may be a temperature that can melt the adhesive layer 32 of the anisotropic conductive film 30, for example, a temperature of about 250° C. to 350° C.

Figure 5:
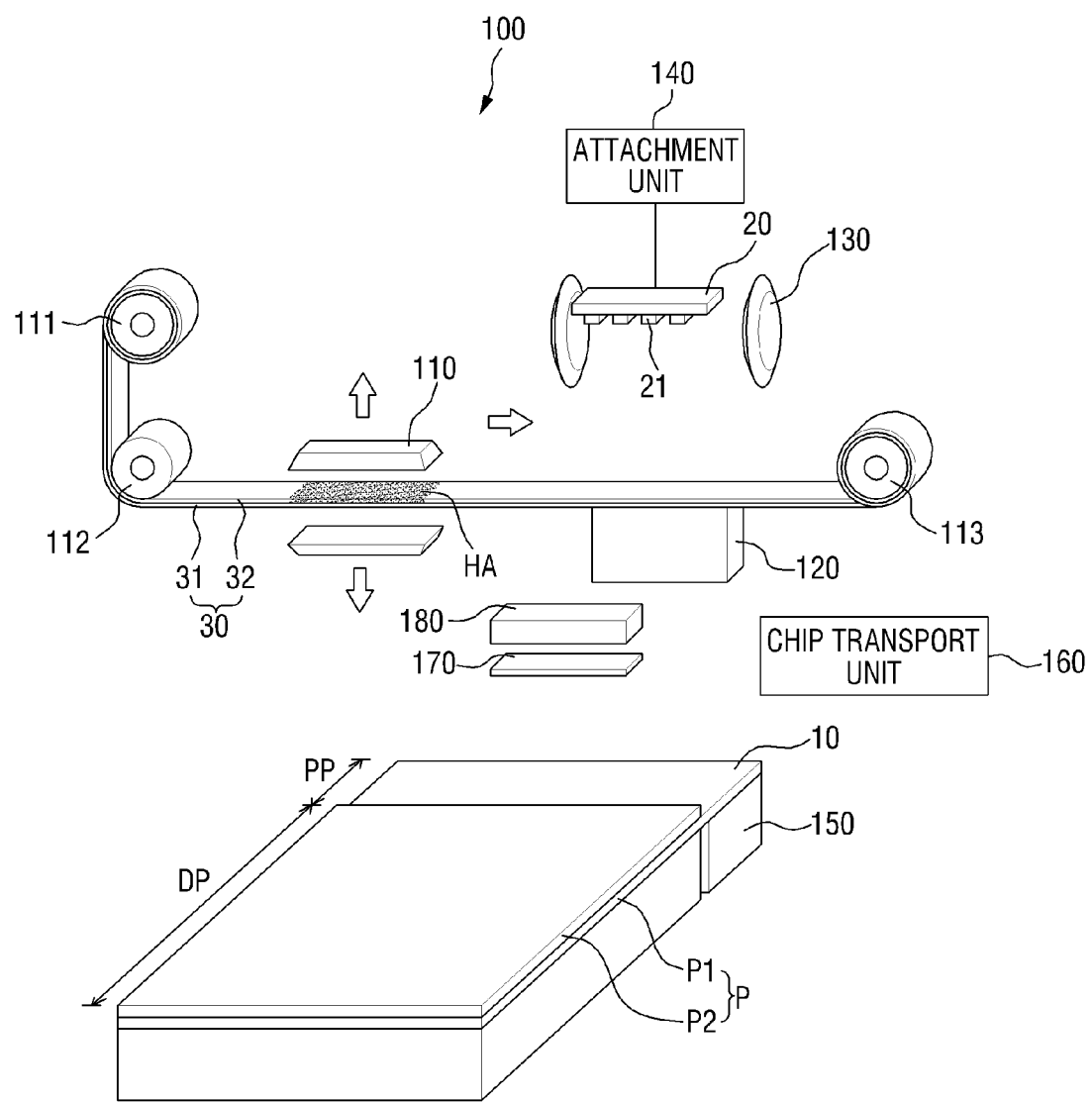
Figure 6:
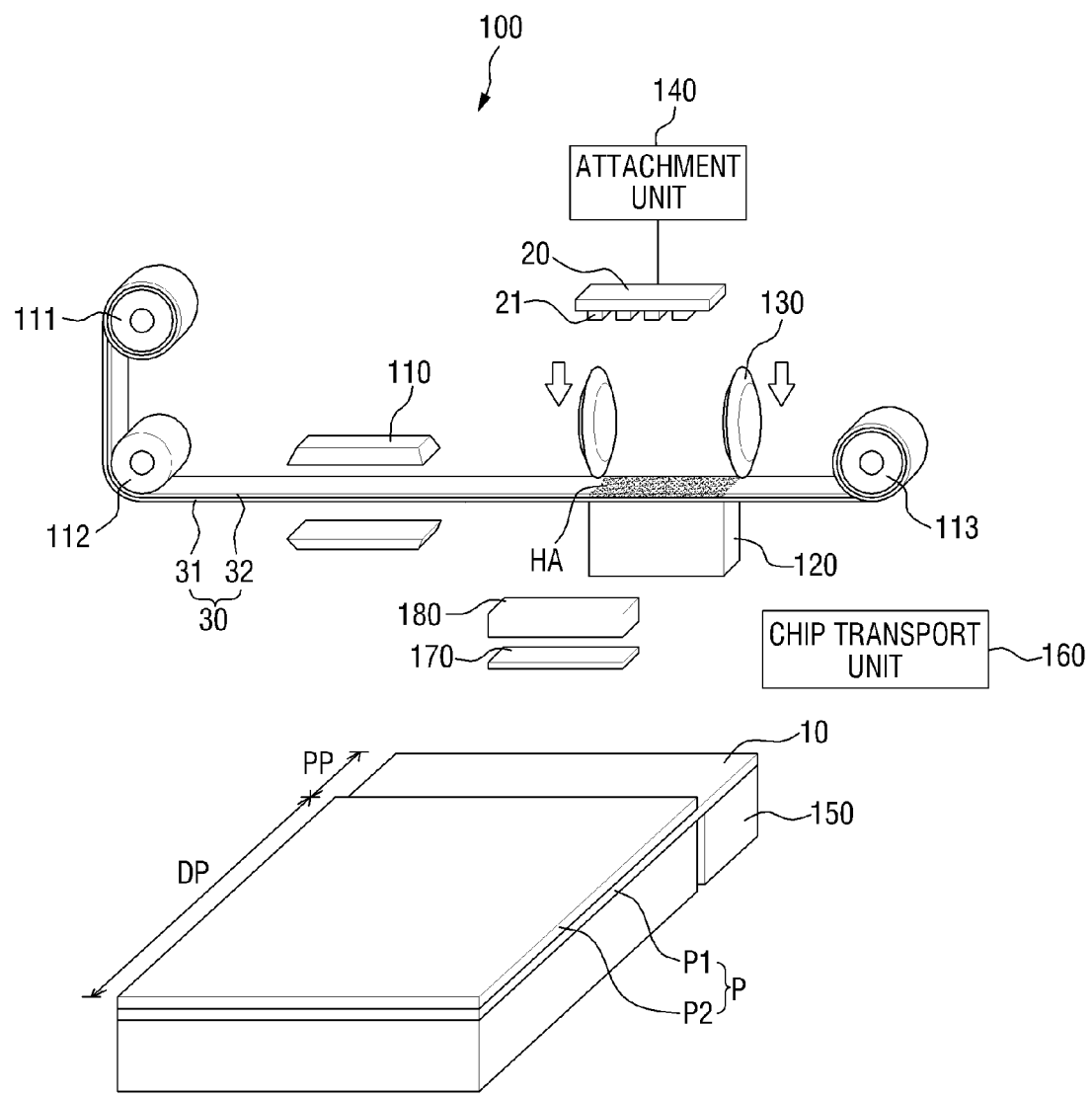

Referring to FIGS. 5 and 6, a boundary portion between a heated area HA and a non-heated area of the adhesive layer 32 of the anisotropic conductive film 30 is cut using a cutting unit 130 to separate the heated area and the non-heated area from each other.

Specifically, as illustrated in FIG. 5, the heating unit 110 is moved vertically so that the heating unit 110 is spaced apart from the anisotropic conductive film 30, and the anisotropic conductive film 30 is horizontally moved in the direction of a support 120. The horizontal movement of the anisotropic conductive film 30 may be performed through driving of a recovery roller 113.

Further, as illustrated in FIG. 6, the heated area HA, which is heated by the heating unit 110, of the adhesive layer 32 of the anisotropic conductive film 30 is arranged on the support 120, and then the cutting unit 130 is moved to cut the boundary portion between the heated area HA and the non-heated area of the adhesive layer 32 of the anisotropic conductive film 30. The cutting unit 130 may be a cutting wheel, but is not limited thereto.

Figure 7:
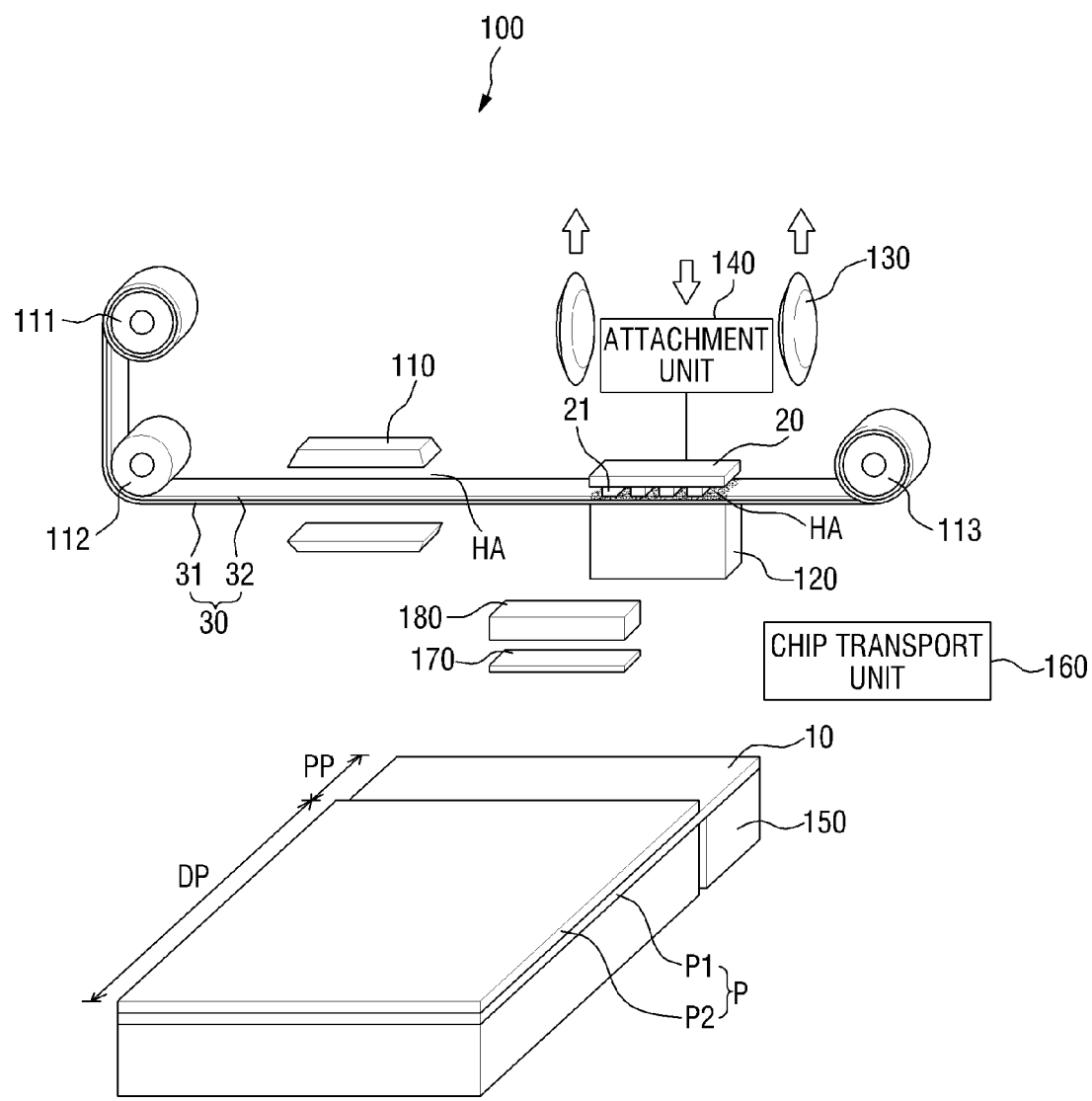
Figure 8:
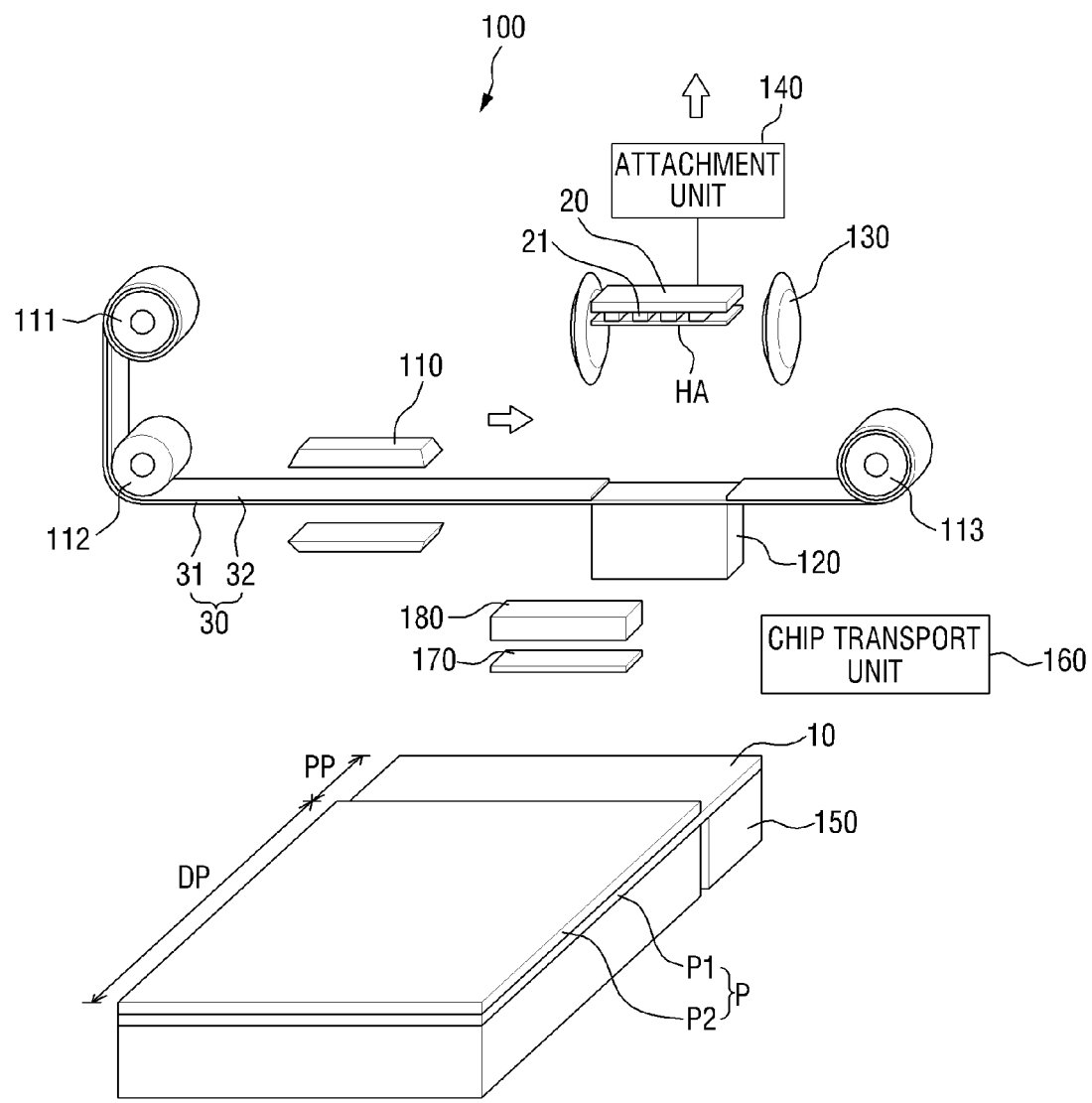

Then, referring to FIGS. 7 and 8, the integrated circuit chip 20 is attached to the heated area HA of the adhesive layer 32 of the anisotropic conductive film 30 using an attachment unit 140.

Specifically, as illustrated in FIG. 7, the cutting unit 130 is moved vertically so that the cutting unit 130 is spaced apart from the anisotropic conductive film 30, and the attachment unit 140 holding the integrated circuit chip 20 is moved vertically so as to make the integrated circuit chip 20 contact the heated area HA of the adhesive layer 32 of the anisotropic conductive film 30.

Then, as illustrated in FIG. 8, the attachment unit 140 is moved vertically so that the integrated circuit chip 20, to which the heated area HA of the adhesive layer 32 of the anisotropic conductive film 30 is attached, is spaced apart from the anisotropic conductive film 30. The attachment unit 140 may include, for example, a robot. The anisotropic conductive film 30, from which the heated area HA is separated by the attachment unit 140, may be recovered by the recovery roller 113.

Figure 9:
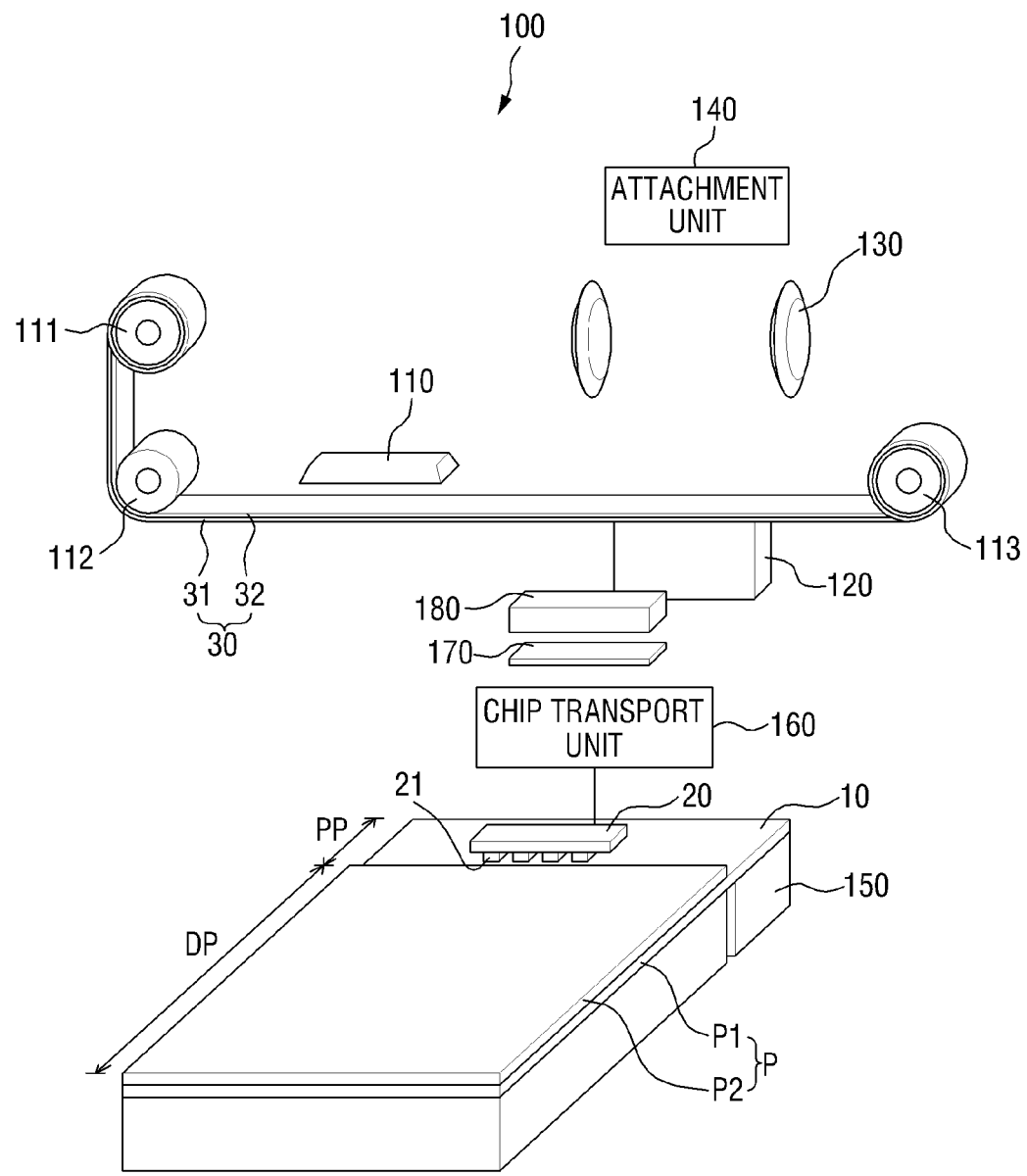

Then, referring to FIG. 9, the integrated circuit chip 20, to which the heated area HA of the adhesive layer 32 of the anisotropic conductive film 30 is attached, is moved and aligned on a pad portion PP of a substrate 10 using a chip transport unit 160. The chip transport unit 160 may be, for example, a robot that can be moved and aligned.

Figure 10:
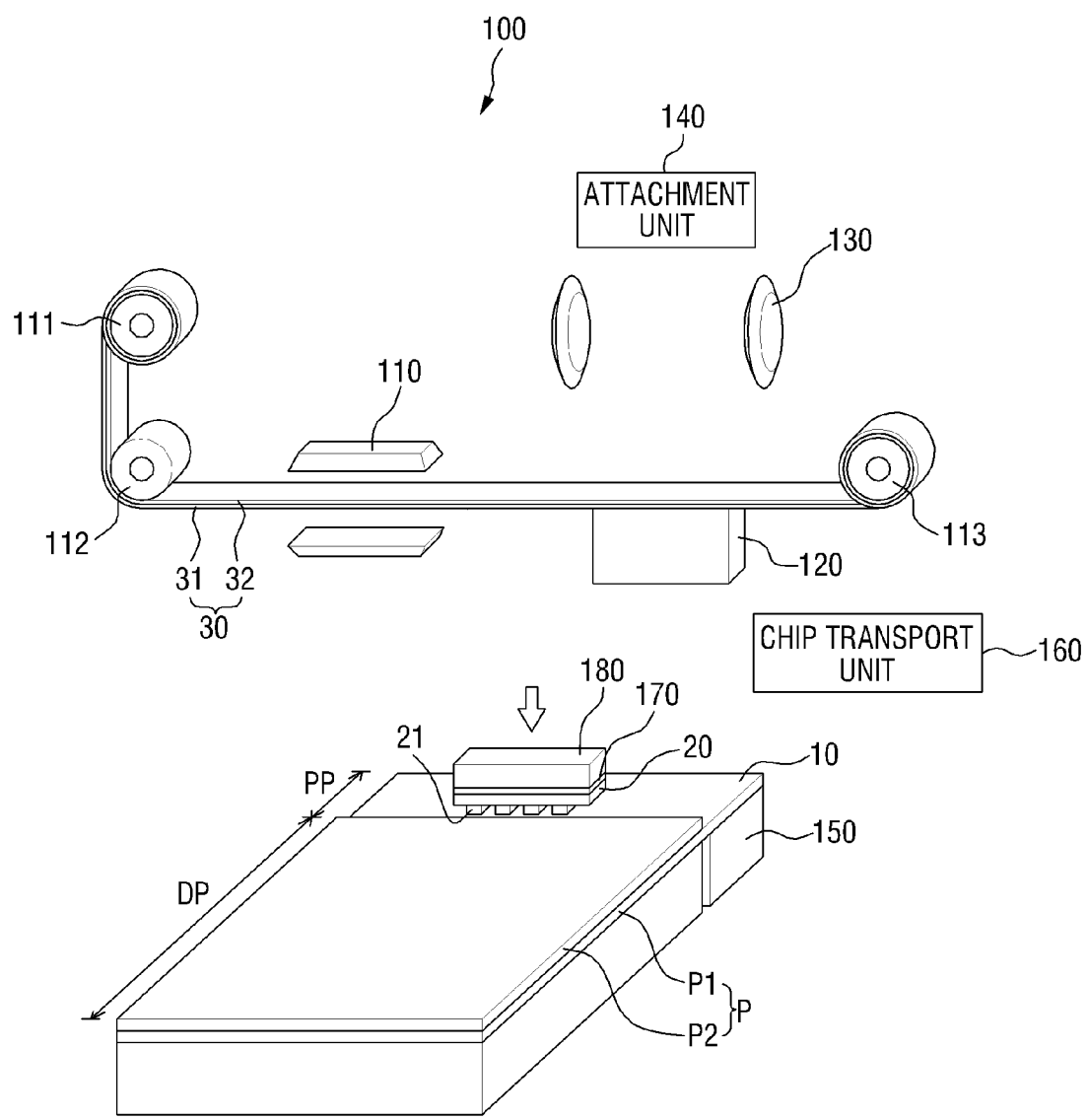

Then, referring to FIG. 10, the integrated circuit chip 20 is thermally compressed onto the pad portion PP of the substrate 10 with compression pressure at a second temperature using a bonding head 180 to bond the integrated circuit chip 20 to the pad portion PP of the substrate 10.

Specifically, the bonding head 180 is vertically moved to transfer heat having the second temperature to the integrated circuit chip 20 while pressing the integrated circuit chip 20. The second temperature may be a temperature of about 20° C. to 30° C.

When the integrated circuit chip 20 is pressed by the bonding head 180, a buffering unit 170 may be interposed between the integrated circuit chip 20 and the bonding head 180 so that the compression pressure of the bonding head 180 is uniformly transferred to the integrated circuit chip 20. The buffering unit 170 may include, for example, a silicon pad.

Next, a chip bonding apparatus according to an exemplary embodiment of the present invention will be described.

Figure 11:
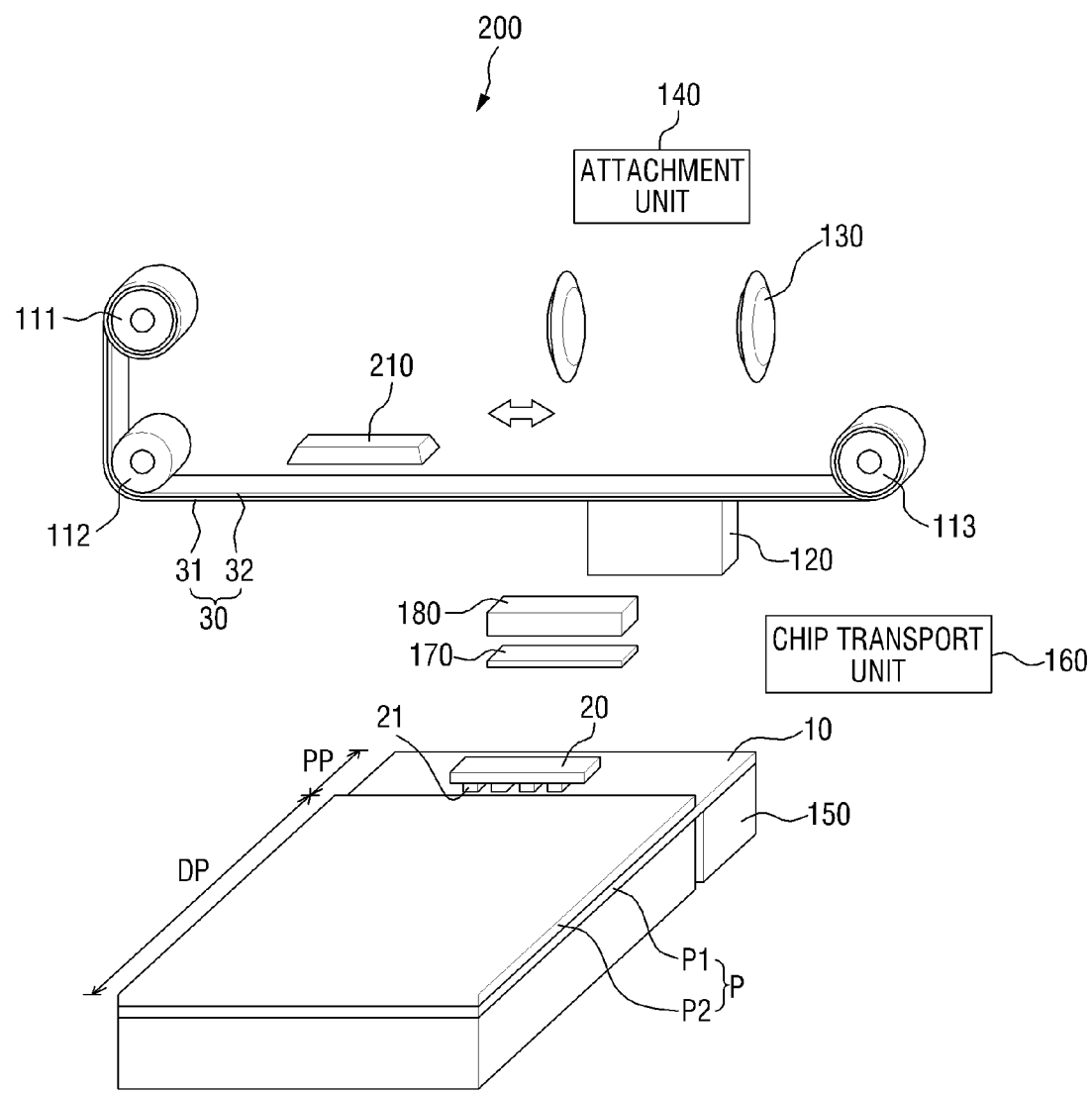
FIG. 11 illustrates the configuration of a chip bonding apparatus according to an exemplary embodiment of the present invention.

FIG. 11 is a view illustrating the configuration of a chip bonding apparatus according to an exemplary embodiment of the present invention.

Referring to FIG. 11, a chip bonding apparatus 200 according to an exemplary embodiment of the present invention has a similar configuration as the configuration of the chip bonding apparatus 100 of FIG. 1 except for a heating unit 210. Accordingly, explanation of the chip bonding apparatus 200 according to the present exemplary embodiment of the present invention will be made around the heating unit 210.

The chip bonding apparatus 200 according to an exemplary embodiment of the present invention includes a heating unit 210, a support 120, a cutting unit 130, an attachment unit 140, a stage 150, a chip transport unit 160, a buffering unit 170, and a bonding head 180. The chip bonding apparatus 200 may be used to bond an integrated circuit chip 20 to a substrate 10 when an adhesive layer 32 of an anisotropic conductive film 30 is interposed between the substrate 10 and the integrated circuit chip 20 using a thermo-compression method.

The heating unit 210 is similar to the heating unit 110 of FIG. 1. However, the heating unit 210 is arranged to be spaced apart from an upper portion of the adhesive layer 32 of the anisotropic conductive film 30 and is configured to heat the adhesive layer 32 of the anisotropic conductive film 30 without contacting the anisotropic conductive film 30. Further, the heating unit 210 is configured to be movable to a region where the attachment unit 140 is located. The heating unit 210 is arranged to heat the adhesive layer 32 of the anisotropic conductive film 30 before the integrated circuit chip 20 is attached to the adhesive layer 32 of the anisotropic conductive film 30 through the attachment unit 140. The heating unit 210 may be, for example, a non-contact type heater.

As described above, since the chip bonding apparatus 200 according to the present exemplary embodiment of the present invention includes the heating unit 210 that heats the anisotropic conductive film 30 before the integrated circuit chip 20 is attached to the adhesive layer 32 of the anisotropic conductive film 30. As such, the bonding head 180 having low temperature can be used during the thermo-compression process using the bonding head 180 as the melting efficiency of the adhesive layer 32 of the anisotropic conductive film 30 is improved.

Accordingly, the occurrence of the flexural deformation, which may occur on an integrated circuit chip 20 that is pressed by the high-temperature bonding head 180 due to the high-temperature heat, maybe reduced. Thus, the partial contact of the bumps 21 of the integrated circuit chip 20 with the adhesive layer 32 of the anisotropic conductive film 30 may also be reduced. As a result, deterioration of the reliability for the electrical connection between the pad portion PP of the substrate 10 and the integrated circuit chip 20 maybe reduced.

A chip bonding method using the chip bonding apparatus 200 is similar to the chip bonding method using the chip bonding apparatus 100 as described above with reference to FIGS. 4 to 10. However, the heating unit 210 according to this embodiment is different from the heating unit 110 according to the above-described embodiment on the point that the heating unit 210 heats the anisotropic conductive film 30 without contacting the anisotropic conductive film 30 before the integrated circuit chip 20 is attached to the adhesive layer 32 of the anisotropic conductive film 30. Accordingly, the detailed explanation of the chip bonding method using the chip bonding apparatus 200 will be omitted.

Next, a chip bonding apparatus according to an exemplary embodiment of the present invention will be described.

Figure 12:
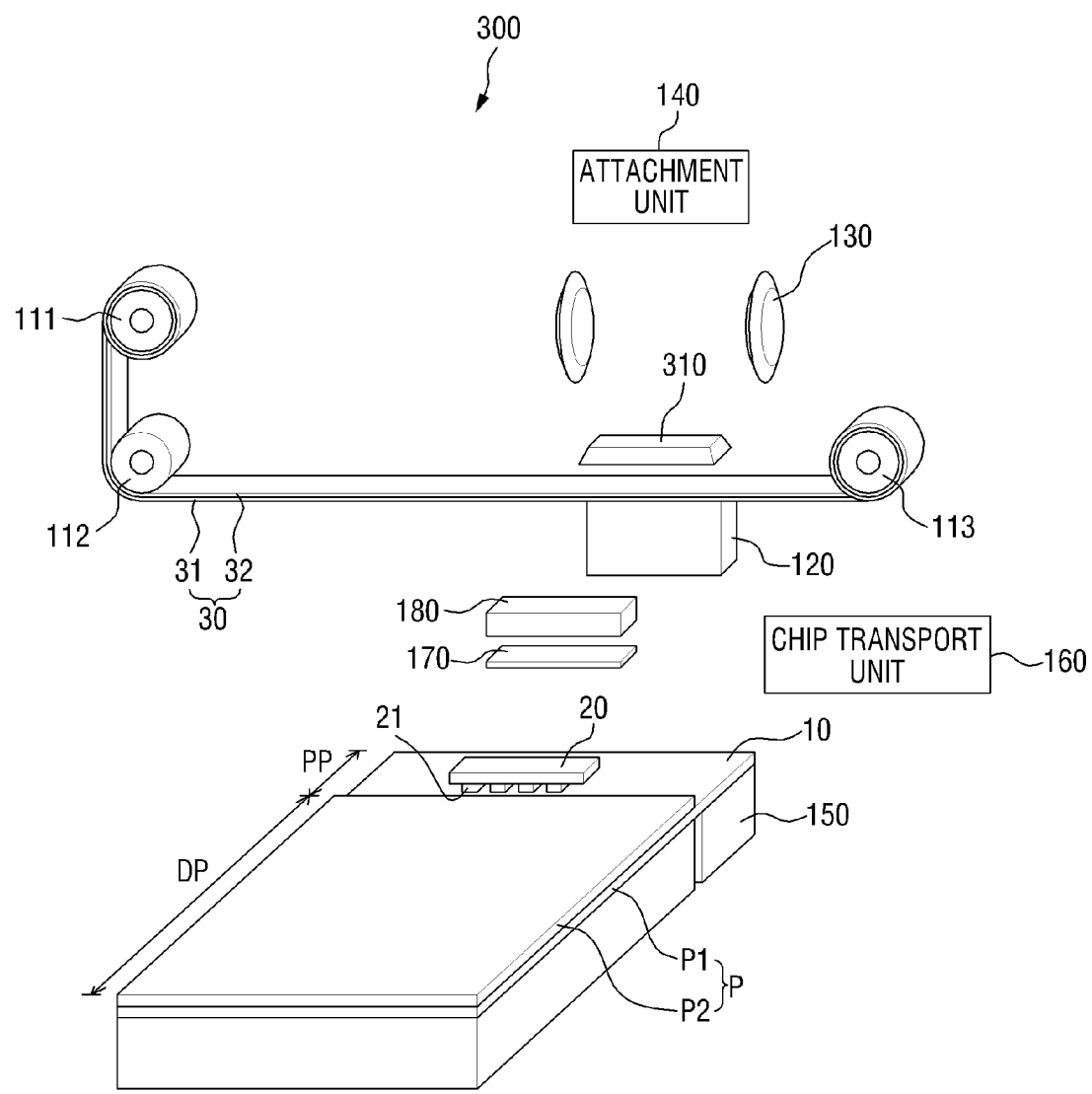
FIG. 12 illustrates another configuration of a chip bonding apparatus according to an exemplary embodiment of the present invention.

FIG. 12 is a view illustrating the configuration of a chip bonding apparatus according to an exemplary embodiment of the present invention.

Referring to FIG. 12, a chip bonding apparatus 300 according to an exemplary embodiment of the present invention has the same configuration as the configuration of the chip bonding apparatus 100 of FIG. 1 except for a heating unit 310. Accordingly, explanation of the chip bonding apparatus 300 according to an exemplary embodiment of the present invention will be made around the heating unit 310.

The chip bonding apparatus 300 according to an exemplary embodiment of the present invention includes a heating unit 310, a support 120, a cutting unit 130, an attachment unit 140, a stage 150, a chip transport unit 160, a buffering unit 170, and a bonding head 180. The chip bonding apparatus 300 may be used to bond an integrated circuit chip 20 to a substrate 10 when an adhesive layer 32 of an anisotropic conductive film 30 is interposed between the substrate 10 and the integrated circuit chip 20 using a thermo-compression method.

The heating unit 310 is similar to the heating unit 110 of FIG. 1. However, the heating unit 310 is arranged in the same region as the region of the attachment unit 140 in a horizontal direction, and is configured to heat the adhesive layer 32 of the anisotropic conductive film 30 without contacting the anisotropic conductive film 30. The conductive film 30 is arranged on the support 120 and spaced apart from an upper portion of the support 120. Since the heating unit 310 heats the adhesive layer 32 of the anisotropic conductive film 30 in a space in which cutting of the anisotropic conductive film 30 can be performed, the processing time before the integrated circuit chip 20 is attached to the adhesive layer 32 of the anisotropic conductive film 30 through the attachment unit 140 maybe reduced. The heating unit 310 may be, for example, a non-contact type heater.

As described above, since the chip bonding apparatus 300 according to the present exemplary embodiment of the present invention includes the heating unit 310 that is arranged to be spaced apart from the upper portion of the support 120 to heat the adhesive layer 32 of the anisotropic conductive film 30, the processing time before the integrated circuit chip 20 is attached to the adhesive layer 32 of the anisotropic conductive film 30 through the attachment unit 140 can be reduced, and the bonding head 180 having low temperature can be used during the thermo-compression process using the bonding head 180.

Accordingly, the occurrence of the flexural deformation, which may occur on an integrated circuit chip 20 that is pressed by the high-temperature bonding head 180 due to the high-temperature heat, can be reduced, and thus the partial contact of the bumps 21 of the integrated circuit chip 20 with the adhesive layer 32 of the anisotropic conductive film 30 can also be reduced. As a result, deterioration of the reliability for the electrical connection between the pad portion PP of the substrate 10 and the integrated circuit chip 20 can be reduced.

A chip bonding method using the chip bonding apparatus 300 is similar to the chip bonding method using the chip bonding apparatus 100 as described above with reference to FIGS. 4 to 10. However, the heating unit 310 according to this embodiment is different from the heating unit 110 according to the above-described embodiment on the point that the heating unit 310 is arranged on the upper portion of the support 120 and heats the anisotropic conductive film 30 in a non-contact manner. Accordingly, the detailed explanation of the chip bonding method using the chip bonding apparatus 300 will be omitted.

According to exemplary embodiments of the present invention, at least the following effects can be achieved.

Since the chip bonding apparatus according to an exemplary embodiment of the present invention includes the heating unit that heats the anisotropic conductive film before the integrated circuit chip is bonded to the pad portion of the substrate through the thermo-compression process using the bonding head, the bonding head having low temperature can be used during the thermo-compression process using the bonding head.

Accordingly, the occurrence of the flexural deformation, which may occur on the integrated circuit chip that is pressed by the high-temperature bonding head during the thermo-compression process using the bonding head due to the high-temperature heat, can be reduced, and thus the partial contact of bumps of the integrated circuit chip with the adhesive layer of the anisotropic conductive film can also be reduced. As a result, deterioration of the reliability for the electrical connection between the pad portion of the substrate and the integrated circuit chip can be reduced.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A chip bonding method, comprising:
    heating an anisotropic conductive film at a first temperature using a heating unit;
    attaching an integrated circuit chip to the anisotropic conductive film using an attachment unit after the anisotropic conductive film is heated at the first temperature;
    moving and aligning the integrated circuit chip attached to the anisotropic conductive film on a substrate seated on a stage using a chip transport unit; and
    bonding the integrated circuit chip that is attached to the anisotropic conductive film onto the substrate through thermo-compression of the integrated circuit chip onto the substrate at a second temperature that is lower than the first temperature using a bonding head disposed on an upper portion of the stage.

2. The chip bonding method of claim 1, wherein the heating the anisotropic conductive film comprises heating the anisotropic conductive film when the heating unit contacts the anisotropic conductive film.

3. The chip bonding method of claim 1, wherein the heating the anisotropic conductive film comprises heating the anisotropic conductive film when the heating unit is spaced apart from the anisotropic conductive film.

4. The chip bonding method of claim 1, wherein the first temperature comprises a temperature of 250° C. to 350° C., and the second temperature comprises a temperature of 20° C. to 30° C.

5. The chip bonding method of claim 1, wherein the heating unit and the attachment unit are disposed in regions that are spaced apart from each other in a horizontal direction, and
    the method further comprises:
        moving the anisotropic conductive film from a region where the heating unit is disposed to a region where the attachment unit is disposed, the moving of the anisotropic conductive film being performed after the heating the anisotropic conductive film and before the attaching the integrated circuit chip to the anisotropic conductive film.

6. The chip bonding method of claim 1, wherein:
    the heating unit and the attachment unit are disposed in regions that are spaced apart from each other in a horizontal direction; and
    the heating of the anisotropic conductive film comprises horizontally moving the heating unit to a region where the attachment unit is disposed before the attaching of the integrated circuit chip to the anisotropic conductive film.

7. The chip bonding method of claim 1, wherein the heating unit and the attachment unit are disposed in the same region in a horizontal direction.

8. The chip bonding method of claim 1, further comprising:
    cutting a boundary portion between a heated area and a non-heated area of the adhesive layer of the anisotropic conductive film using a cutting unit, the cutting of the boundary portion being performed after the heating the anisotropic conductive film and before the attaching the integrated circuit chip to the anisotropic conductive film.

9. The chip bonding method of claim 8, wherein the cutting the boundary portion between the heated area and the non-heated area of the adhesive layer of the anisotropic conductive film is performed on a support that provides an area where the heated anisotropic conductive film is supported.

10. The chip bonding method of claim 9, wherein the attachment unit is disposed above the support and faces the adhesive layer of the anisotropic conductive film.

11. The chip bonding method of claim 1, further comprising:
    guiding the anisotropic conductive film that is wound on a winding roller to a region where the heating unit is disposed through a guide roller, the guiding of the anisotropic layer being performed before the heating of the anisotropic conductive film.

12. The chip bonding method of claim 11, further comprising:
    recovering the anisotropic conductive film through a recovery roller after the heating of the anisotropic conductive film.

* * * * *